(12) United States Patent
Das

(10) Patent No.: US 9,760,435 B2
(45) Date of Patent: Sep. 12, 2017

(54) APPARATUS AND METHOD FOR GENERATING COMMON LOCATOR BITS TO LOCATE A DEVICE OR COLUMN ERROR DURING ERROR CORRECTION OPERATIONS

(71) Applicant: INTEL CORPORATION, Santa Clara, CA (US)

(72) Inventor: Debaleena Das, Los Gatos, CA (US)

(73) Assignee: INTEL CORPORATION, Santa Clara, CA (US)

( * ) Notice: Subject to any disclaimer, the term of this patent is extended or adjusted under 35 U.S.C. 154(b) by 32 days.

(21) Appl. No.: 14/883,610

(22) Filed: Oct. 14, 2015

(65) Prior Publication Data
US 2017/0109230 A1  Apr. 20, 2017

(51) Int. Cl.
| H03M 13/00 | (2006.01) |
| G06F 11/10 | (2006.01) |
| G11C 29/52 | (2006.01) |
| G06F 3/06  | (2006.01) |

(52) U.S. Cl.
CPC ........ *G06F 11/1068* (2013.01); *G06F 3/064* (2013.01); *G06F 3/0619* (2013.01); *G06F 3/0679* (2013.01); *G11C 29/52* (2013.01)

(58) Field of Classification Search
CPC .... G06F 11/1068; G06F 3/0619; G06F 3/064; G06F 3/0679
See application file for complete search history.

(56) References Cited

U.S. PATENT DOCUMENTS

| 6,332,206 B1* | 12/2001 | Nakatsuji | G11B 20/18 714/755 |
| 6,379,135 B2* | 4/2002 | Schofield | F04C 18/16 418/194 |
| 6,563,511 B1* | 5/2003 | Yeh | G09G 5/36 345/589 |
| 6,957,378 B2* | 10/2005 | Koga | G06F 11/1032 714/763 |

(Continued)

OTHER PUBLICATIONS

Fujitsu, "Memory Performance of Xeon E7-8800/4800 v2 (Ivy Bridge-EX) Based Systems", White Paper, Version 1.1, May 16, 2014, 27 pp.

(Continued)

*Primary Examiner* — Esaw Abraham
(74) *Attorney, Agent, or Firm* — Konrad Raynes Davda & Victor LLP; David W. Victor

(57) ABSTRACT

Provided are an apparatus and method for generating common locator bits to locate a device or column error during error correction operation for a memory subsystem having memory modules, each including a plurality of memory devices. Error detection logic generates common locator bits from device bits in a plurality of memory devices in one of the memory modules. The error detection logic uses the common locator bits to locate a column across at least two of the memory devices having an error when there is a column error and to locate a memory device in the devices having an error when there is a device error. A same of the common locator bits are used to locate both one of the columns and the memory devices having errors. Error correction is performed on the located memory device or column having the error.

22 Claims, 8 Drawing Sheets

(56) References Cited

U.S. PATENT DOCUMENTS

| | | | | |
|---|---|---|---|---|
| 7,020,811 | B2* | 3/2006 | Byrd | H04L 1/004 714/52 |
| 7,231,578 | B2* | 6/2007 | Hassner | G11B 20/18 714/762 |
| 7,530,008 | B2 | 5/2009 | Das et al. | |
| 7,603,592 | B2* | 10/2009 | Sekiguchi | G06F 11/1044 365/201 |
| 7,844,886 | B1* | 11/2010 | Ngo | G06F 11/1004 714/725 |
| 7,882,425 | B2* | 2/2011 | Lee | G06F 11/1092 714/804 |
| 8,196,004 | B1* | 6/2012 | Tang | H03M 13/2909 714/755 |
| 2014/0047265 | A1 | 2/2014 | Das et al. | |

OTHER PUBLICATIONS

JEDEC, "DDR4 SDRAM", JEDEC Standard, JESD79-4, Sep. 2012, 214 pp.
JEDEC, "Double Data Rate (DDR) SDRAM Specification", JEDEC Standard, JESD79C, Mar. 2003, 82 pp.
JEDEC, "High Bandwidth Memory (HBM) DRAM", JEDEC Standard, JESD235, Oct. 2013, 124 pp.
JEDEC, "Low Power Double Data Rate 3 (LPDDR3)", JEDEC Standard, JESD209-3C, Aug. 2015, 158 pp.
JEDEC, "Low Power Double Data Rate 4 (LPDDR4)", JEDEC Standard, JESD209-4, Aug. 2014, 196 pp.
JEDEC, "Wide I/O 2 (WideIO2)", JEDEC Standard, JESD229-2, Aug. 2014, 116 pp. [Submitted as Parts A, B, and C due to EFS-Web file size restrictions].
Lvov, A., et al., "Verification of Galois Field Based Circuits by Formal Reasoning Based on Computational Algebraic Geometry", [online], [Retrieved on Sep. 11, 2015], retrieved from the Internet at <URL: https://www.research.ibm.com/haifa/projects/verification/SixthSense/papers/x.pdf>, 26 pp.
Macronix International Co., Ltd., "NAND Error Correction Codes Introduction", Technical Note, Rev. 1, Feb. 17, 2014, 17 pp.
Wikipedia, "Lockstep (Computing)", [online], Last Modified Feb. 2, 2015, [Retrieved on Aug. 18, 2015], retrieved from the Internet at <URL: https://en.wikipedia.org/w/index.php?title=Lockstep_(computing)&oldid=645348899>, 3 pp.
Wikipedia, "Reed-Solomon Error Correction", [online], Last Modified Sep. 6, 2015, [Retrieved on Sep. 12, 2015], Retrieved from the Internet at <URL: https://en.wikipedia.org/w/index.php?title=Reed-Solomon_error_correction&oldid=679705050>, 15 pp.
Willhalm, T., "Independent Channel vs. Lockstep Mode—Drive your Memory Faster or Safer", [online], Jul. 11, 2014, [Retrieved on Aug. 18, 2015], retrieved from the Internet at <URL: https://software.intel.com/en-us/blogs/2014/07/11/independent-channel-vs-lockstep-mode-drive-you-memory-faster-or-safer#>, 3 pp.
"EE 387 Notes #10", Notes for Stanford Math Course, "Algebraic Error-Control Codes", Instructor John Gill, [online], [Retrieved Aug. 31, 2015], Retrieved from the Internet at <URL: http://web.stanford.edu/class/ee387/handouts/notes10.pdf>, 18 pp.
"EE 387 Notes #10", Notes for Stanford Math Course "Algebraic Error-Control Codes", Instructor John Gill, [online], Oct. 9, 2015, Retrieved from the Internet at <URL: http://web.stanford.edu/class/ee387/handouts/notes10.pdf>, 12 pp.

* cited by examiner

FIG. 2

| Device 1 | | | | Device 2 | | | | Device 3 | | | | Device 4 | | | |
|---|---|---|---|---|---|---|---|---|---|---|---|---|---|---|---|
| d0 | d1 | d2 | d3 | d0 | d1 | d2 | d3 | d0 | d1 | d2 | d3 | d0 | d1 | d2 | d3 |
| d4 | d5 | d6 | d7 | d4 | d5 | d6 | d7 | d4 | d5 | d6 | d7 | d4 | d5 | d6 | d7 |
| d8 | d9 | d10 | d11 | d8 | d9 | d10 | d11 | d8 | d9 | d10 | d11 | d8 | d9 | d10 | d11 |
| d12 | d13 | d14 | d15 | d12 | d13 | d14 | d15 | d12 | d13 | d14 | d15 | d12 | d13 | d14 | d15 |
| d16 | d17 | d18 | d19 | d16 | d17 | d18 | d19 | d16 | d17 | d18 | d19 | d16 | d17 | d18 | d19 |
| d20 | d21 | d22 | d23 | d20 | d21 | d22 | d23 | d20 | d21 | d22 | d23 | d20 | d21 | d22 | d23 |
| d24 | d25 | d26 | d27 | d24 | d25 | d26 | d27 | d24 | d25 | d26 | d27 | d24 | d25 | d26 | d27 |
| d28 | d29 | d30 | d31 | d28 | d29 | d30 | d31 | d28 | d29 | d30 | d31 | d28 | d29 | d30 | d31 |

FIG. 3

| Device 1 | | | | Device 2 | | | | Device 3 | | | | Device 4 | | | |
|---|---|---|---|---|---|---|---|---|---|---|---|---|---|---|---|
| d0 | d1 | d2 | d3 | a0 | a1 | a2 | a3 | d0 | d1 | d2 | d3 | d0 | d1 | d2 | d3 |
| d4 | d5 | d6 | d7 | a4 | a5 | a6 | a7 | d4 | d5 | d6 | d7 | d4 | d5 | d6 | d7 |
| d8 | d9 | d10 | d11 | a8 | a9 | a10 | a11 | d8 | d9 | d10 | d11 | d8 | d9 | d10 | d11 |
| d12 | d13 | d14 | d15 | a12 | a13 | a14 | a15 | d12 | d13 | d14 | d15 | d12 | d13 | d14 | d15 |
| d16 | d17 | d18 | d19 | a16 | a17 | a18 | a19 | d16 | d17 | d18 | d19 | d16 | d17 | d18 | d19 |
| d20 | d21 | d22 | d23 | | | | | d20 | d21 | d22 | d23 | d20 | d21 | d22 | d23 |
| d24 | d25 | d26 | d27 | | | | | d24 | d25 | d26 | d27 | d24 | d25 | d26 | d27 |
| d28 | d29 | d30 | d31 | | | | | d28 | d29 | d30 | d31 | d28 | d29 | d30 | d31 |

APPARATUS AND METHOD FOR GENERATING COMMON LOCATOR BITS TO LOCATE A DEVICE OR COLUMN ERROR DURING ERROR CORRECTION OPERATIONS

TECHNICAL FIELD

Embodiments described herein generally relate to an apparatus and method for generating common locator bits to locate a device or column error during error correction operations.

BACKGROUND

Block error correcting codes used in memory devices, such as Reed Solomon codes, have two portions, parity across the blocks that identifies the failed bits within a block and a locator portion that identifies the location of a failed block. One way to enhance Error Correction Code (ECC) coverage is to use a technique that distributes error correction over multiple memory resources to compensate for a hard failure in one memory resource that prevents deterministic data access to the failed memory resource. This distributed error correction is referred to as lockstep memory or chipkill. A lockstep memory comprises a multi-channel memory layout in which the data of one cache line is distributed between two different memory channels, so one half of a cache line is stored in a first memory module, such as a Dual in line Memory Module (DIMM), on a first channel, while the second half of the cache line goes to a second memory module on a second channel. A dual in-line memory module (DIMM) comprises a series of dynamic random-access memory integrated circuits mounted on a printed circuit board. For instance, for 4 byte wide (x4) DIMMS, combining single error correction and double error detection capabilities of two ECC DIMMs in a lockstep layout, their single device data correction (SDDC) can be extended into double device data correction.

Additionally, for 8 byte wide (x8) DIMMSs, without lockstep, each DRAM device contributes 8 bytes of data per cache line. In the case of a device failure, a block of 8 bytes is affected. The number of ECC bits available is not sufficient to do a block correction of 8 bytes. Once lockstep is enabled, each DRAM device now contributes 4 bytes of data to a cache line. The ECC bits available are now sufficient to correct a block of 4 bytes and SDDC is achieved.

There is a need in the art for improved techniques for performing error correction in lockstep memory modes.

BRIEF DESCRIPTION OF THE DRAWINGS

Embodiments are described by way of example, with reference to the accompanying drawings, which are not drawn to scale, in which like reference numerals refer to similar elements.

FIGS. 2 and 3 illustrate examples of devices on a memory module.

DESCRIPTION OF EMBODIMENTS

Lockstep memory operations typically utilize two memory channels to get complete fault isolation between the two lockstep parts or halves of the cache line. However, in certain memory architectures, there may be an odd number of channels, such that one memory channel is unused.

Described embodiments provide techniques for intra channel lockstep operations to allow lockstep operations be performed in a single channel by writing the different halves of the cache line to different devices on different memory modules on the same memory channel or on different ranks of devices in the same memory module on one memory channel. In order to allow for correction of both device errors and channel errors in an intra channel lockstep operation, described embodiments provide techniques for generating a common locator syndrome having bits that operate as both a device locator syndrome and column locator syndrome that may be used to identify the column or device in the lockstep operation having the errors. In this way, the bits of two block error correcting codes, for device and column, are compressed into a single set of common locator syndrome bits with the available ECC bits. This reduces the number of ECC bits, so that both ECCs for column and device error correction can fit into available ECC space. This enables use of intra-channel lockstep and eliminates the penalty of an unused channel in a memory system with an odd number of memory channels.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 1:
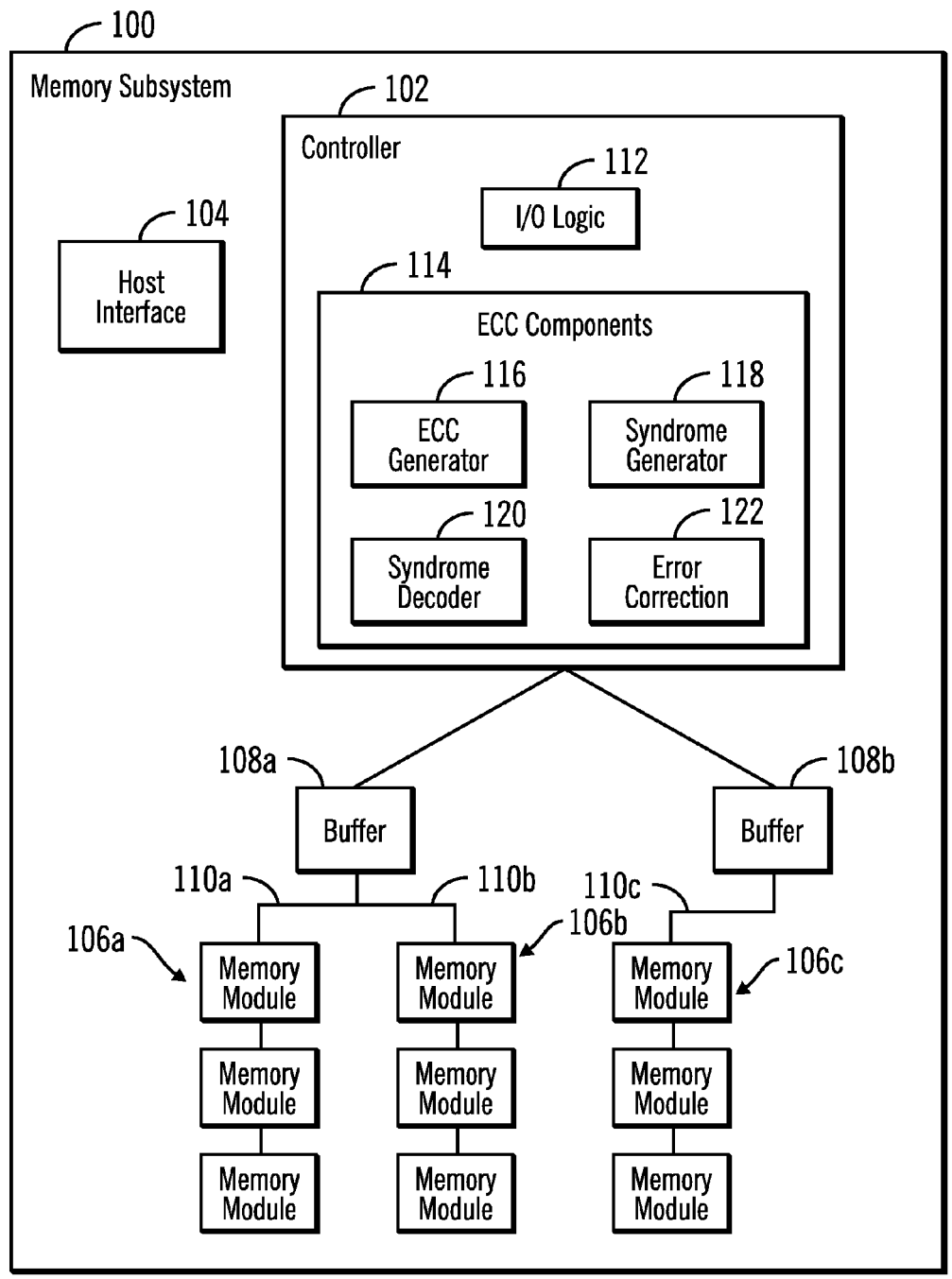
FIG. 1 illustrates an embodiment of a memory subsystem.

FIG. 1 illustrates an embodiment of a non-volatile memory subsystem 100 having a controller 102, a host interface 104, sets of memory modules 106a, 106b, 106c, and buffers 108a and 108b used to buffer data transmitted between the controller 102 and the memory modules 106a, 106b, 106c. In certain embodiments, there may be no separate host interface 104, and the memory controller 102 may comprise an integrated memory controller on a system on a chip. The memory modules 106a, 106b, 106c may comprise volatile or non-volatile memory resources. In one embodiment, the memory modules may comprise Direct Random Access Memory (DRAM). The memory module resources can be managed, for example, as different levels of memory with separate channels, DIMMs (dual inline memory modules), ranks, DRAMs, banks, pages, rows, cache lines, and/or other architecture. Each separate memory level and resource can be individually addressable.

The DIMMs may be a type of double data rate (DDR) memory, such as for a Dynamic Random Access Memory (DRAM) or synchronous dynamic random-access memory (SDRAM). A memory subsystem as described herein may be compatible with a number of memory technologies, such as DDR3 (Dual Data Rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications.

Memory modules $106a$ connect on memory channel $110a$, memory modules $106b$ connect on memory channel $110b$, and the memory modules $106c$ connect on memory channel $110c$.

The memory controller 102 may distribute cache lines between two of the memory modules $110a$, $110b$ on different channels $110a$ and $110b$. Half a cache line is located on a memory module $106a$ on one channel $110a$ and another half of the cache line is on a memory module $106b$ on another channel $110b$. Further, the memory controller 102 may operate in an intra channel lockstep mode where a cache line is split within a single channel $110c$, where the halves of the cache line are distributed to different memory modules $106c$ on one memory channel $106c$ or in different ranks of one memory module $106c$ within the single memory channel $106c$. The memory controller 102 may further perform intra lockstep operations to split a cache line into two lockstep halves within each of the channels $110a$, $110b$. With the architecture of FIG. 1, the memory controller 102 may maintain lockstep operations even when there are an odd number of channels $106a$, $106b$, $106c$, because for the odd channel $110c$, intra channel lockstep mode may be performed. Alternatively, intra channel lockstep operations may be performed for the even number of memory channels $110a$, $110b$.

The memory architecture of FIG. 1 is by way of example, and additional embodiments may have more or less buffers $108a$, $108b$, more or less memory modules $106a$, $106b$, $106c$ and more or less memory channels $110a$, $110b$, $110c$.

The memory subsystem 100 may function as both a memory subsystem and/or a storage device in a computing system.

The controller 102 includes Input/Output (I/O) logic 112 to perform read and write operations in intra lockstep mode (across two memory channels) and intra channel lockstep mode. Alternatively, the I/O logic 112 may only perform operations in intra channel lockstep mode. The controller 102 includes error correction code (ECC) components 114 to perform error correction operations with respect to data stored in the memory modules $106a$, $106b$, $106c$. The ECC components 114 include an ECC generator 116 to generate ECC check bits when storing data in the memory modules memory modules. The ECC generator 116 may generate parity check bits for each of the devices in the memory modules $106a$, $106b$, $106c$ and for columns of the devices. Device errors result from failures within a device and column errors result from errors introduced when transferring the data through the memory channels $110a$, $110b$, $110c$.

In one example, for intra channel lockstep operations, for each half cache line written to a rank in a memory module, there may be n bits per device per cache line, e.g., 16 bits, and columns may extend through two devices, where each column is n/2 bits, e.g., 8 bits, and extends through two 4 bit columns in an upper and lower devices. In such case, the ECC generator 116 may generate 40 ECC bits, n*2 device parity and locator bits for the upper and lower devices in a lockstep intra channel write and n/2 8 parity bits for the n/2 bit columns.

The ECC components 114 further include a syndrome generator 118 to generate column locator syndrome, column parity syndrome, device parity syndrome, and device locator syndrome values from the ECC bits stored with the data; a syndrome decoder 120 that uses the syndromes computed by the syndrome generator 118 to determine a device or column in which there is an error; and an error correction module 122 to correct the errors in the located column or the device.

The host interface 104 connects the memory subsystem 100 to a host system, such as over a bus interface. The memory subsystem 100 may be installed or embedded within a host system, such as shown and described with respect to FIG. 7, or the memory subsystem 100 may be external to the host system. The host interface 104 may comprise a bus interface, such as a Peripheral Component Interconnect Express (PCIe) interface, Serial AT Attachment (SATA), Non-Volatile Memory Express (NVMe), etc.

FIG. 2 illustrates an example of four upper devices $200_1$, $200_2$, $200_3$, $200_4$ and four lower devices $202_1$, $202_2$, $202_3$, $202_4$, where there may be 16 each of upper and lower data devices and two ECC devices. The upper devices $200_1$, $200_2$, $200_3$, $200_4$ may receive the data for one half of a cache line and the lower devices lower devices $202_1$, $202_2$, $202_3$, $202_4$ may receive data for the other half of the cache line, where these devices may be on separate memory modules on one memory channel or on different ranks of a single memory module also on a single channel in an inter-lockstep mode. As shown in FIG. 2, an error may occur on a device, such as device $202_3$ or on a column 204 across an upper $200_1$ and lower $202_1$ devices. As mentioned, a column error may result from errors in the channel $110a$, $110b$, $110c$.

A rank comprises devices in the memory module that are connected to the same address and data bus, such that if there are multiple ranks on a memory module, only one rank of devices on a memory module may be accessed at one time.

In described embodiments, common locator bits may be generated by applying, e.g., multiplying, elements from a Galois Field to the upper and lower devices for each pair of devices. For instance, if each device has n bits, e.g., 16 bits, elements may be selected from a $2^n$ Galois field, e.g., $2^{16}$, to multiply across the bits of the upper and lower devices. The resulting syndrome locator bits can be used to locate both columns and devices having an error by using the common locator bits to calculate both device locator syndrome and the column locator syndrome.

FIG. 3 illustrates an example of how the elements of a $2^{16}$ Galois Field, noted as a0 . . . a16 are applied to the device bits in an upper device $200_2$ and lower device $202_2$. In described embodiments, for each pair of upper and lower devices, a unique element, i.e., ai, may be selected as the starting point from the Galois Field and then consecutive elements are applied across the device bits. In the described embodiments, a unique element from the Galois Field is selected from which to start multiplication of consecutive elements to the device bits, and another element a fixed amount from the element selected for the upper device is selected as the starting point to multiply by the bits in the lower device $202_2$. In the example of FIG. 3, the unique element from the Galois Field selected for the upper device $200_2$ is a0 and a4 is selected as the starting point for the lower device $202_2$, which is a fixed number of elements from the element selected for the upper device. In this way, consecutive elements of the Galois Field are applied across the bits of the device and consecutive elements are also being applied across the columns extending through an upper and lower devices to which data is written in intra channel lockstep.

The resulting multiplication of the Galois Field elements across the devices is summed to obtain a device locator syndrome whose bits also operate as the column locator syndrome. In this way, the same locator bits are used for locating a device error and column error as described below to allow the device and column having the error in the upper and lower devices to which data is lockstep written through a single memory channel.

Figure 4:
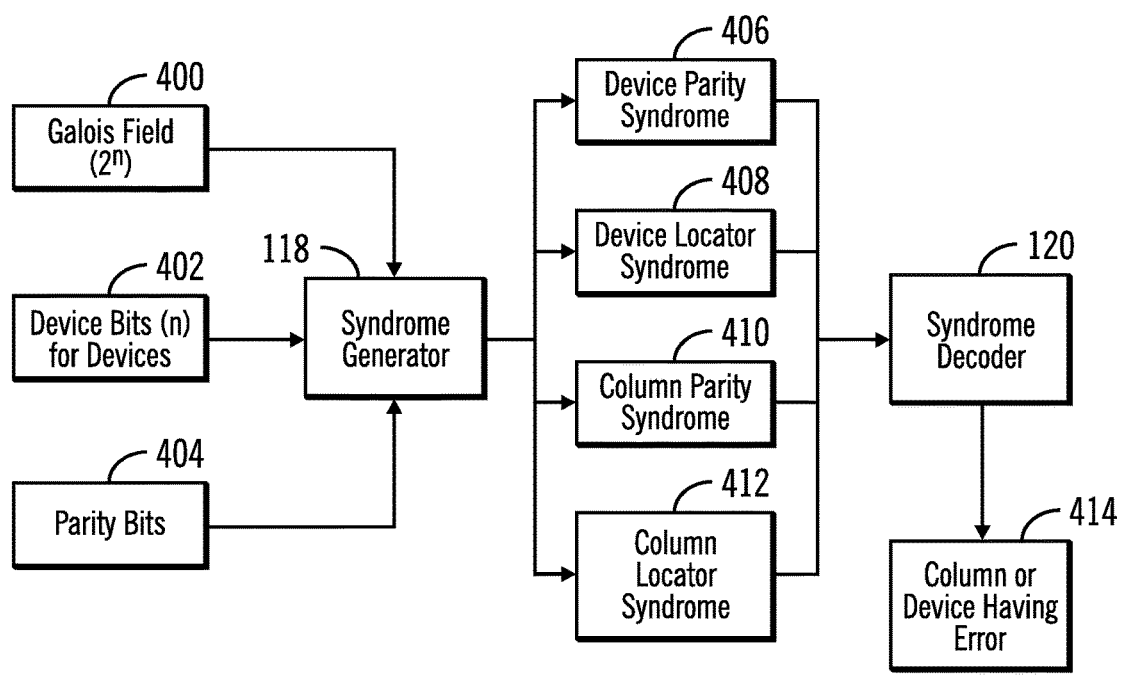
FIG. 4 illustrates an embodiment of the input and output for error correction components.

FIG. 4 illustrates the inputs and output error correction information for the syndrome generator 118 and syndrome decoder 120, including a Galois Field ($2^n$) 400, where n is the number of bits in a lockstep device being protected, device bits (n) 402 for each of the devices subject to the error correction, e.g., upper devices $200_1$, $200_2$, $200_3$, $200_4$ and lower devices $202_1$, $202_2$, $202_3$, $202_4$; parity bits 404 for the column and device parity of the devices 402; device parity syndrome 406; device locator syndrome 408; column parity syndrome 410; column locator syndrome 412; and identified column or device having the error 414.

In described embodiments, the error correction operations may use standard Reed Solomon codes and the locators are constructed by multiplying the bits in the devices by the elements from a Galois Field 400, where the size of the field is the size of the bits in the device being protected. The common locator or common locator syndrome is achieved by designing an array of elements that works across two fields. In the example above, the locator can handle GF($2^n$) multiplications as well as GF($2^{n/2}$) multiplications for columns of length=n/2 extending across upper and lower devices. The column multiplication uses zero padding to convert elements to size n. In the described embodiments, the device locator syndrome 408 bits perform the role of a device locator when working with the device parity and the very same bits perform the role of a column locator when working with the column parity.

Figure 5A:
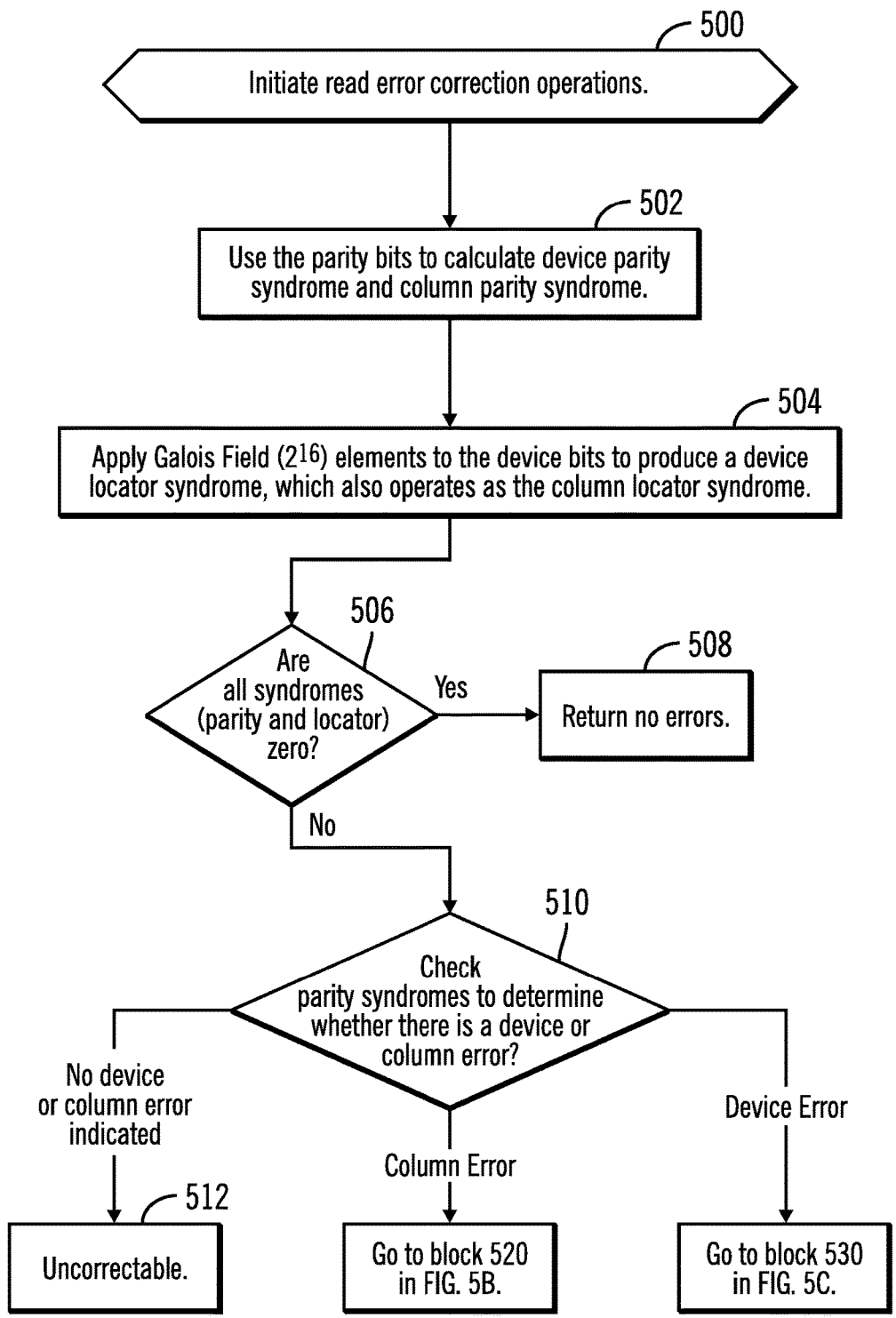
FIGS. 5a, 5b, and 5c illustrate an embodiment of operations to perform error correction for intra channel lockstep memory mode.
Figure 5B:
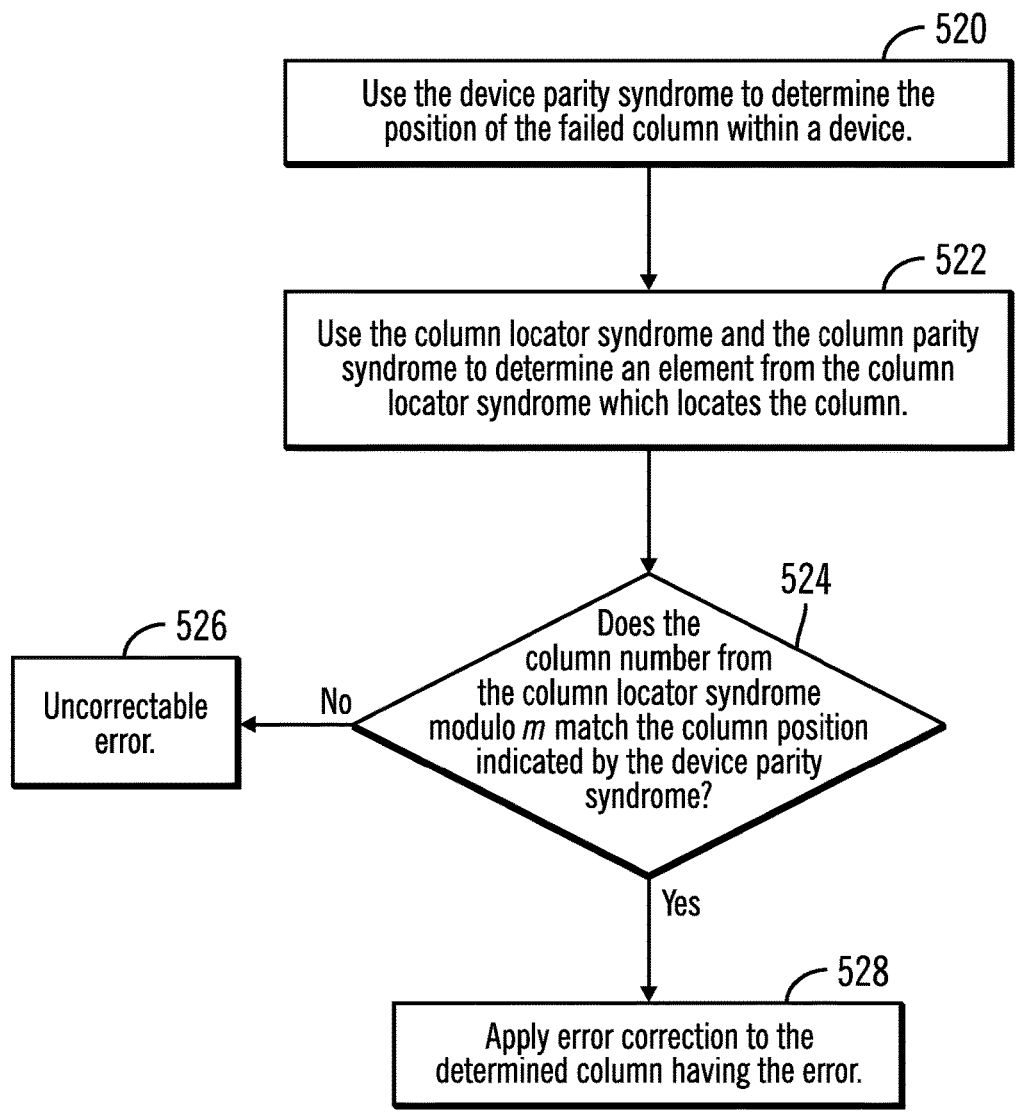
Figure 5C:
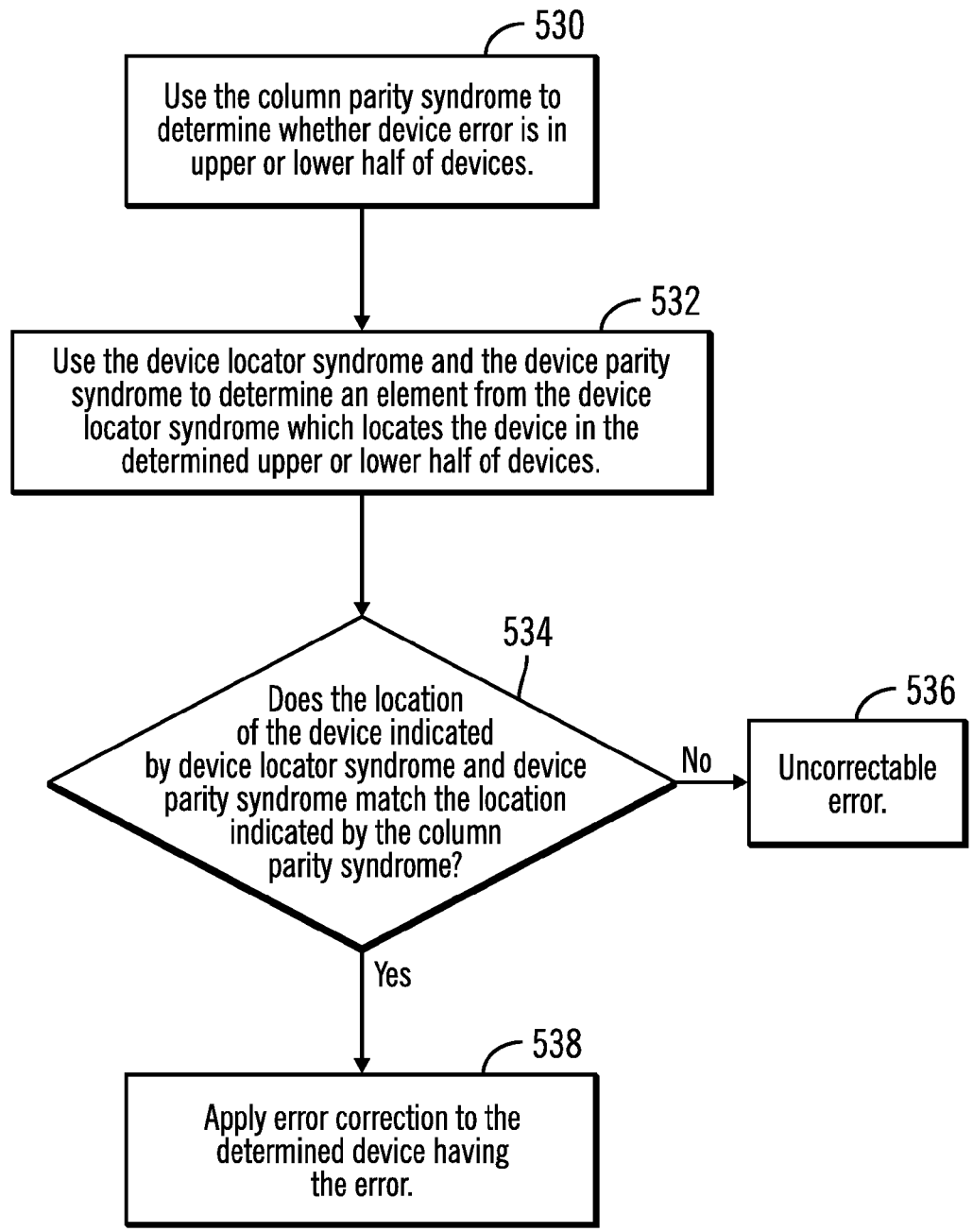

FIGS. 5a, 5b, and 5c illustrate an embodiment of operations performed by the ECC components 114 such as the syndrome generator 118, syndrome decoder 120, and error correction 122 when reading data from the memory modules 106a, 106b, 106c devices in an intra channel lockstep operation, as described with respect to the error correction information of FIG. 4.

Upon initiating (at block 500) read error correction operations, the syndrome generator 118 uses the parity bits 404 for the stored device data 402 to calculate (at block 502) device parity syndrome 406 and a column parity syndrome 410. The syndrome generator 118 further applies (at block 504) elements from a Galois Field ($2^n$) 400, where n is the number of bits in each of the upper and lower devices, upper devices $200_k$, $200_2$, $200_3$, $200_4$ and lower devices $202_1$, $202_2$, $202_3$, $202_4$, to the bits in the devices 402 and performs a summation to generate the device locator syndrome 408, whose bits also operates as the column locator syndrome 412. The device locator syndrome 408 is also referred to as a common locator or common locator syndrome for having bits that operate as both the device locator syndrome 408 and the column locator syndrome 412. When each of the upper and lower devices have 16 bits, then elements from a $2^{16}$ Galois field would be selected to apply to the device bits.

If (at block 506) all the syndromes 406, 408, 410, and 412, both parity and locator, are zero, then no errors are returned (at block 508). Otherwise, if (at block 506) all syndromes 406, 408, 410, and 412 are not zero, then the syndrome decoder 120 processes (at block 510) the parity syndromes to determine whether there is a column error, device error or neither. If (at block 510) no column or device errors are indicated, then an uncorrectable state is returned (at block 512), because the column or device having the error could not be identified when the syndromes 406, 408, 410, and 412 indicated an error.

If (at block 510) the parity syndromes 406, 410 indicate a column error, then control proceeds to block 520 in FIG. 5b where the syndrome decoder 120 uses (at block 520) the device parity syndrome 406 to determine the position of the failed column within a device, which may be indicated by the column in the device parity syndrome 406 having a value. When there is the column error, the device parity syndrome 406 may include a single non-zero column indicating the column position of the failed column.

The syndrome decoder 120 uses (at block 522) the column locator syndrome 412 and the column parity syndrome 410 to determine an element from the column locator syndrome 412 which locates the column in the intra channel lockstep operation. In one embodiment, the element from the column locator syndrome 412 comprises the element in the Galois field 400, and its position modulo m, where m indicates the number of columns of bits in the devices, indicates the column position. In the Example of FIGS. 2 and 3, m is 4. If (at block 524) the column number from the column locator syndrome 412 modulo m, e.g., 4, matches the column position indicated in the device parity syndrome 406, then the column 414 is correctly determined and the error correction module 122 applies (at block 528) error correction to the determined column 414 having the error using the column parity information 404. If (at block 524) there is no match determined from the different sources, e.g., device parity syndrome 406 and column locator syndrome and 412 versus the column parity syndrome 410, then the column 414 could not be located, i.e., decoded, and an uncorrectable error state is returned (at block 526).

If (at block 510) the device 406 and column 410 parity syndrome indicates a device error, then control proceeds to block 530 in FIG. 5c, the syndrome decoder 120 uses (at block 530) the column parity syndrome 410 to determine whether the device error is in the upper, e.g., $200_1$, $200_2$, $200_3$, $200_4$, or the lower, e.g., $202_1$, $202_2$, $202_3$, $202_4$, devices. For instance, if the device parity syndrome is non-zero, then to determine whether the non-zero parity syndrome is for one of the upper or lower devices, the column parity syndrome 410 may be examined to see if the error is in the upper or lower half of the column, such that the device having the error is an upper device e.g., $200_1$, $200_2$, $200_3$, $200_4$, if the error is in the upper half of the column parity syndrome or the error is in a lower device, e.g., $202_1$, $202_2$, $202_3$, $202_4$, if the error is in the lower half of the column parity syndrome. The syndrome decoder 120 further uses (at block 532) the device locator syndrome 408 and the device parity syndrome 406 to determine an element from the device locator syndrome 408 which locates the device having the error in the upper or lower half of the devices, which may comprise the first unique element selected from the Galois Field 400 to apply to the first, e.g., least significant bit, of the device bits 402 to which the elements were consecutively applied. If (at block 534) the location of the device indicated by the device locator syndrome 408 and device parity syndrome 406 matches the device location indicated by the column parity syndrome 406, then the error correction module 122 applies (at block 538) error correction to the determined device 414 having the error using the device parity information 404. If (at block 534) there is no match determined from the different sources, e.g., device parity syndrome 406 and column locator syndrome 412 and column parity syndrome, then the device could not be located and an uncorrectable error state is returned (at block 536).

With the described embodiment, the determined device locator syndrome bits are used for both the device locator syndrome and the column locator syndrome, thus compressing the device locator syndrome and column locator syndrome into the same set of common syndrome bits of the device locator syndrome.

Figure 6:
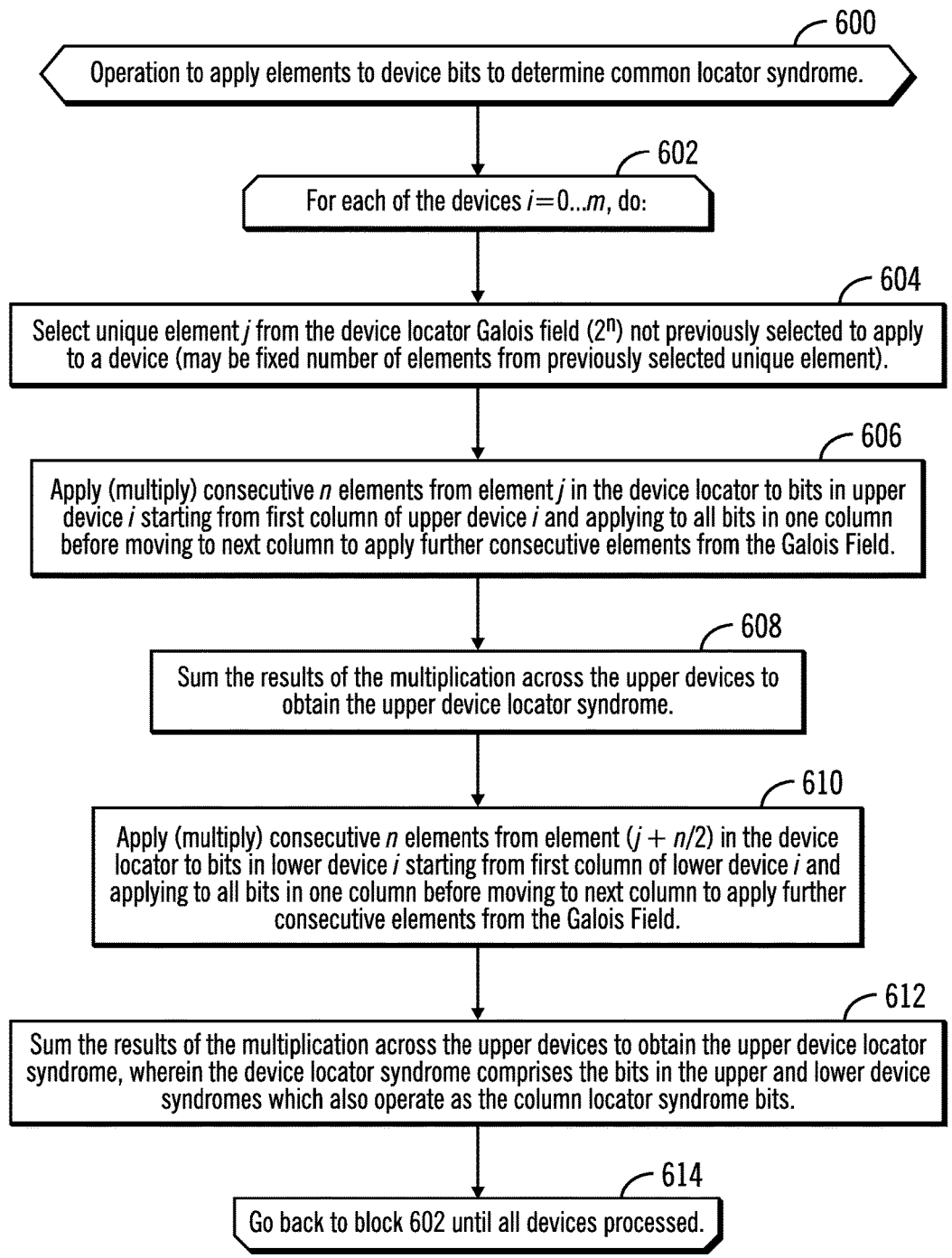
FIG. 6 illustrates an embodiment of operations to generate a common locator syndrome.

FIG. 6 illustrates an embodiment of operations performed by the syndrome generator 118 to determine the common locator syndrome having both the device locator syndrome 408 and column locator syndrome 410. Upon initiating (at block 600) the operations to determine the common locator syndrome, the syndrome generator 118 performs a loop of operations at block 602 through 610 for each upper and lower device i through which data is written and read in intra channel lockstep mode, where there are 0 through m devices for which error correction is performed in the intra channel lockset mode. At block 604, the syndrome generator 118 selects (at block 604) a unique element j from the Galois field ($2^n$) 400, not previously selected, to apply to a device i. In one embodiment, a selected unique element, such as an alpha from the Galois Field 400 is a fixed number of elements from the previously selected unique element. The syndrome generator 118 applies (at block 606) by matrix multiplication consecutive n elements from element j in the Galois Field 400 to bits in the upper device i starting from first column of upper device i and applying to all bits in one column before moving to next column to apply further consecutive elements from the Galois Field 400. The results of the multiplication of the Galois Field 400 element across the upper devices are summed (at block 608) to obtain the upper device locator syndrome. The syndrome generator 118 applies (at block 610) by matrix multiplication consecutive n elements from element j+n/2 in the Galois Field 400 to bits in the lower device i starting from first column of lower device i and applying to all bits in one column before moving to next column to apply further consecutive elements from the Galois Field 400. The results of the multiplication of the Galois Field 400 element across the lower devices are summed (at block 612) to obtain the lower device locator syndrome.

The resulting operation of applying the elements Galois Field 400 to the device bits 402 of each of the devices is a common locator syndrome having device locator syndrome 408 and column locator syndrome 412. For instance, FIG. 3 shows the results of the operations of FIG. 6 of separately multiplying consecutive alpha elements starting from a0 of the Galois Field to the bits in the upper device $200_2$ and multiplying elements starting at element a4, a fixed number (four) from the selected element a0, to the bits in the lower device 202. The column syndrome locator comprises the device syndrome bits in the upper and lower devices that form a column, e.g., 206.

Figure 7:
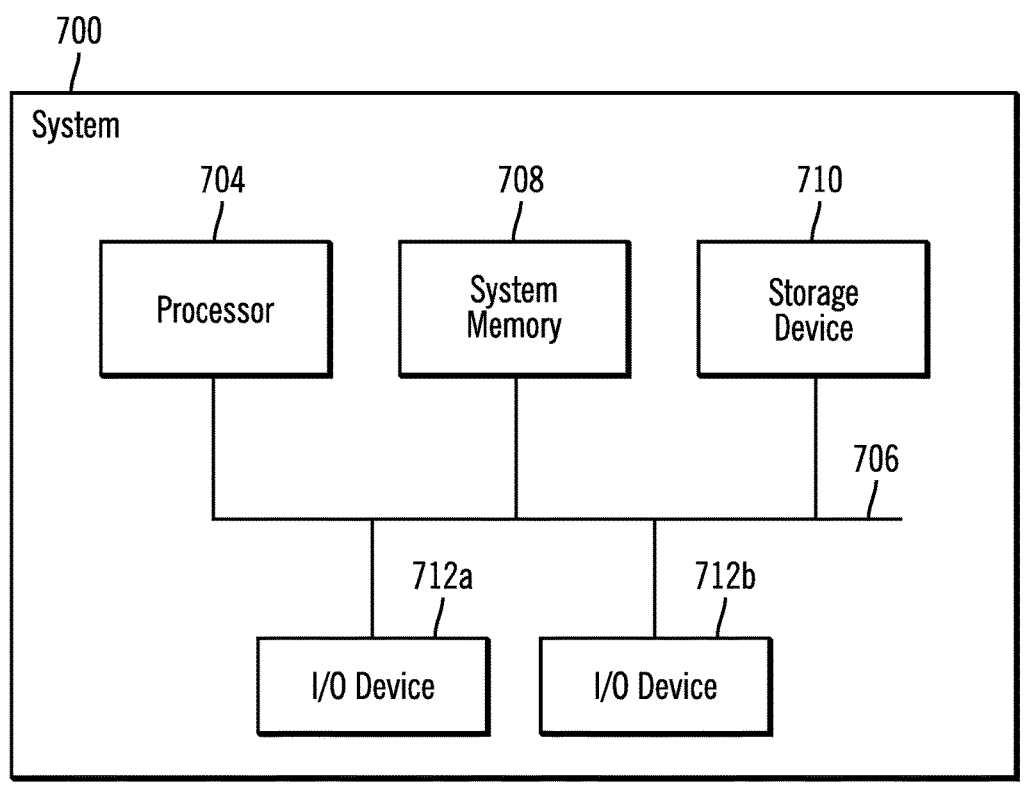
FIG. 7 illustrates a system in which the memory subsystem of FIG. 1 may be deployed.

FIG. 7 illustrates an embodiment of a system 700 in which the memory subsystem 100 may be deployed as the system memory 708. The system includes a processor 704 that communicates over a bus 706 with a system memory device 708 in which programs, operands and parameters being executed are cached, and a storage device 710, which may comprise a solid state drive (SSD) or other non-volatile storage, that stores programs and user data that may be loaded into the system memory 708 for execution. The processor 704 may also communicate with Input/Output (I/O) devices 712a, 712b, which may comprise input devices (e.g., keyboard, touchscreen, mouse, etc.), display devices, graphics cards, ports, network interfaces, etc. The memory 708 and storage device 710 may be coupled to an interface on the system 700 motherboard, mounted on the system 700 mother board, or deployed in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The reference characters used herein, such as i, j and n, are used herein to denote a variable number of instances of an element, which may represent the same or different values, and may represent the same or different value when used with different or the same elements in different described instances.

EXAMPLES

The following examples pertain to further embodiments.

Example 1 is an apparatus for managing errors in a memory subsystem having a plurality of memory modules, comprising: error detection logic: to generate common locator bits from device bits in a plurality of memory devices in one of the memory modules; to use the common locator bits to locate a column across at least two of the memory devices having an error when there is a column error; and to use the common locator bits to locate a memory device in the plurality of memory devices having an error when there is a device error, wherein a same of the common locator bits are used to locate both one of the columns and the memory devices having errors; and error correction logic to perform error correction on the located memory device or column having the error.

In Example 2, the subject matter of Examples 1 and 3-11 can optionally include that the common locator bits include bits that operate as a device locator syndrome and a column locator syndrome, wherein the device locator syndrome is used to locate the memory device having the errors and the column locator syndrome is used to locate the column having the errors.

In Example 3, the subject matter of Examples 1, 2 and 4-11 can optionally include a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the devices to which the data is written in lockstep through the channel.

In Example 4, the subject matter of Examples 1-3 and 5-11 can optionally include that the memory modules comprise DIMMs.

In Example 5, the subject matter of Examples 1-4 and 6-11 can optionally include that the generating the common locator comprises multiplying the device data, each memory device having m bits, by elements from a 2m Galois field and summing up.

In Example 6, the subject matter of Examples 1-5 and 7-11 can optionally include that the common locator bits operate as a device locator syndrome bits and a column locator syndrome bits, wherein the using the common locator bits to locate a column across at least two of the memory devices having the column error comprises using the column locator syndrome and a column parity syndrome to locate a column number in one of the memory devices having the error, and wherein using the common locator bits to locate a memory device in the memory devices having an error when there is a device error comprises using the device locator syndrome and a device parity syndrome to locate a device number one of the memory devices having the error.

In Example 7, the subject matter of Examples 1-6 and 8-11 can optionally include that the operations further comprise: using the device parity syndrome to determine a column position of a failed column within one of the memory devices when there is the column error; determining whether the column number determined from the column locator syndrome and the column parity syndrome matches the column position indicated by the device parity syndrome, wherein the column error correction is applied in response to determining that the column number matches the column position.

In Example 8, the subject matter of Examples 1-7 and 9-11 can optionally include a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column; wherein the detection logic is further: to use the column parity syndrome to determine whether a device error is in a upper or lower memory device when there is the device error, wherein the device locator syndrome and the device parity syndrome locate the device error in the upper or lower memory device; and to determine whether the column parity syndrome and the device location syndrome and the device parity syndrome separately identify that the device error is in a same of the upper or lower memory device, wherein the device error correction is applied in response to determining that the same upper or lower memory device is identified.

In Example 9, the subject matter of Examples 1-8, 10, and 11 can optionally include that when there is the column error, the device parity syndrome includes only a single non-zero column indicating the column position of the failed column.

In Example 10, the subject matter of Examples 1-9 and 11 can optionally include a channel, wherein data is written lockstep to an upper device and a lower memory device through the channel, wherein one column extends through the upper and lower memory devices, such that each column has an upper portion of m bits from the upper memory device in the column and a lower portion of m bits from the lower memory device in the column, and wherein generating the common locator bits comprises: for each of the upper memory devices, selecting a unique element from a Galois Field from which consecutive elements from the Galois Field are multiplied by the bits in the upper device; summing the results of the multiplication across the upper memory devices to obtain the device locator syndrome for the upper memory devices; for each of the lower memory devices, selecting an element from the Galois Field that is a fixed distance from the unique element selected for the upper memory device from which consecutive elements from the Galois Field are multiplied by the bits in the lower memory device; and summing the results of the multiplication across the lower memory devices to obtain the device locator syndrome for the lower memory devices, wherein the common locator bits comprise the bits in the upper and lower memory device locator syndromes which also operate as the column locator syndrome bits.

In Example 11, the subject matter of Examples 1-10 can optionally include that the determined upper or lower memory device having the error comprises the upper or lower memory device whose selected unique element from the common locator bits comprises an element determined from using the device locator syndrome and device parity values, and wherein the determined column having the error comprises the column whose selected unique element comprises the determined element determined from using the column locator syndrome and column parity syndrome.

Example 12 is a system, comprising: a processor; and a memory subsystem comprising: a plurality of memory modules each having memory devices each comprising columns of bits, wherein at least two of the devices include error correction bits; error detection logic: to generate common locator bits from device bits in a plurality of memory devices in one of the memory modules; to use the common locator bits to locate a column across at least two of the memory devices having an error when there is a column error; and to use the common locator bits to locate a memory device in the plurality of memory devices having an error when there is a device error, wherein a same of the common locator bits are used to locate both one of the columns and the memory devices having errors; error correction logic to perform error correction on the located memory device or column having the error; and a bus coupling the processor to the memory subsystem, wherein the processor accesses programs and data from the memory subsystem to process.

In Example 13, the subject matter of Examples 12 and 14-18 can optionally include that the common locator bits include bits that operate as a device locator syndrome and a column locator syndrome, wherein the device locator syndrome is used to locate the memory device having the errors and the column locator syndrome is used to locate the column having the errors.

In Example 14, the subject matter of Examples 12, 13 and 15-18 can optionally include that the memory subsystem further comprises: a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the devices to which the data is written in lockstep through the channel.

In Example 15, the subject matter of Examples 12-14 and 16-18 can optionally include that the generating the common locator comprises multiplying the device data, each memory device having m bits, by elements from a 2m Galois field and summing up.

In Example 16, the subject matter of Examples 12-15, 17, and 18 can optionally include that the common locator bits operate as a device locator syndrome bits and a column locator syndrome bits, wherein the using the common locator bits to locate a column across at least two of the memory devices having the column error comprises using the column locator syndrome and a column parity syndrome to locate a column number in one of the memory devices having the error, and wherein using the common locator bits to locate a memory device in the memory devices having an error when there is a device error comprises using the device locator syndrome and a device parity syndrome to locate a device number one of the memory devices having the error.

In Example 17, the subject matter of Examples 12-16 and 18 can optionally include that the memory subsystem further includes: a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column; wherein the detection logic is further: to use the column parity syndrome to determine whether a device error is in a upper or lower memory device when there is the device error, wherein the device locator syndrome and the device parity syndrome locate the device error in the upper or lower memory device; and to determine whether the column parity syndrome and the device location syndrome and the device parity syndrome separately identify that the device error is in a same of the upper or lower memory device, wherein the device error correction is applied in response to determining that the same upper or lower memory device is identified.

In Example 18, the subject matter of Examples 12-17 can optionally include that the memory subsystem further includes: a channel, wherein data is written lockstep to an upper device and a lower memory device through the channel, wherein one column extends through the upper and lower memory devices, such that each column has an upper portion of m bits from the upper memory device in the column and a lower portion of m bits from the lower memory device in the column, and wherein generating the common locator bits comprises: for each of the upper memory devices, selecting a unique element from a Galois Field from which consecutive elements from the Galois Field are multiplied by the bits in the upper device; summing the results of the multiplication across the upper memory devices to obtain the device locator syndrome for the upper memory devices; for each of the lower memory devices, selecting an element from the Galois Field that is a fixed distance from the unique element selected for the upper memory device from which consecutive elements from the Galois Field are multiplied by the bits in the lower memory device; and summing the results of the multiplication across the lower memory devices to obtain the device locator syndrome for the lower memory devices, wherein the common locator bits comprise the bits in the upper and lower memory device locator syndromes which also operate as the column locator syndrome bits.

Example 19 is a method for performing error correction in a memory subsystem having memory modules, each including a plurality of memory devices each comprising columns of bits, wherein at least two of the devices include error correction bits, comprising: generating common locator bits from device bits in a plurality of memory devices in one of the memory modules; using the common locator bits to locate a column across at least two of the memory devices having an error when there is a column error; using the common locator bits to locate a memory device in the plurality of memory devices having an error when there is a device error, wherein a same of the common locator bits are used to locate both one of the columns and the memory devices having errors; and performing error correction on the located memory device or column having the error.

In Example 20, the subject matter of Example 19 can optionally include at least one step of:

(1) wherein the common locator bits include bits that operate as a device locator syndrome and a column locator syndrome, wherein the device locator syndrome is used to locate the memory device having the errors and the column locator syndrome is used to locate the column having the errors; and/or (2) wherein the memory subsystem further includes a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the devices to which the data is written in lockstep through the channel; and/or (3) wherein the memory modules comprise DIMMs; and/or (4) wherein the generating the common locator comprises multiplying the device data, each memory device having m bits, by elements from a 2m Galois field and summing up; and/or (5) wherein the common locator bits operate as a device locator syndrome bits and a column locator syndrome bits, wherein the using the common locator bits to locate a column across at least two of the memory devices having the column error comprises using the column locator syndrome and a column parity syndrome to locate a column number in one of the memory devices having the error, and wherein using the common locator bits to locate a memory device in the memory devices having an error when there is a device error comprises using the device locator syndrome and a device parity syndrome to locate a device number one of the memory devices having the error; and/or (6) using the device parity syndrome to determine a column position of a failed column within one of the memory devices when there is the column error; determining whether the column number determined from the column locator syndrome and the column parity syndrome matches the column position indicated by the device parity syndrome, wherein the column error correction is applied in response to determining that the column number matches the column position; and/or (7) wherein the memory subsystem further includes a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column; using the column parity syndrome to determine whether a device error is in a upper or lower memory device when there is the device error, wherein the device locator syndrome and the device parity syndrome locate the device error in the upper or lower memory device; and determining whether the column parity syndrome and the device location syndrome and the device parity syndrome separately identify that the device error is in a same of the upper or lower memory device, wherein the device error correction is applied in response to determining that the same upper or lower memory device is identified; and/or (8) wherein when there is the column error, the device parity syndrome includes only a single non-zero column indicating the column position of the failed column; and/or (9) wherein the memory subsystem further includes a channel, wherein data is written lockstep to an upper device and a lower memory device through the channel, wherein one column extends through the upper and lower memory devices, such that each column has an upper portion of m bits from the upper memory device in the column and a lower portion of m bits from the lower memory device in the column, and wherein generating the common locator bits comprises: for each of the upper memory devices, selecting a unique element from a Galois Field from which consecutive elements from the Galois Field are multiplied by the bits in the upper device; summing the results of the multiplication across the upper memory devices to obtain the device locator syndrome for the upper memory devices; for each of the lower memory devices, selecting an element from the Galois Field that is a fixed distance from the unique element selected for the upper memory device from which consecutive elements from the Galois Field are multiplied by the bits in the lower memory device; and summing the results of the multiplication across the lower memory devices to obtain the device locator syndrome for the lower memory devices, wherein the common locator bits comprise the bits in the upper and lower memory device locator syndromes which also operate as the column locator syndrome bits; and/or

(10) wherein the determined upper or lower memory device having the error comprises the upper or lower memory device whose selected unique element from the common locator bits comprises an element determined from using the device locator syndrome and device parity values, and wherein the determined column having the error comprises the column whose selected unique element comprises the determined element determined from using the column locator syndrome and column parity syndrome.

Example 27 is an apparatus for managing errors in a memory subsystem having a plurality of memory modules, comprising: means for generating common locator bits from device bits in a plurality of memory devices in one of the memory modules; means for using the common locator bits to locate a column across at least two of the memory devices having an error when there is a column error; means for using use the common locator bits to locate a memory device in the plurality of memory devices having an error when there is a device error, wherein a same of the common locator bits are used to locate both one of the columns and the memory devices having errors; and means for performing perform error correction on the located memory device or column having the error.

Example 28, the subject matter of Example 27 can optionally include that the common locator bits include bits that operate as a device locator syndrome and a column locator syndrome, wherein the device locator syndrome is used to locate the memory device having the errors and the column locator syndrome is used to locate the column having the errors.

Example 29 is an apparatus comprising means to perform a method as claimed in any preceding claim.

Example 30 is a machine-readable storage including machine-readable instructions, when executed, to implement a method or realize an apparatus or system as claimed in any preceding claim.

What is claimed:

1. An apparatus for managing errors in a memory subsystem having a plurality of memory modules, comprising:
a controller including error correction components:
to generate common locator bits from device bits in a plurality of memory devices in one of the memory modules, wherein the common locator bits include bits that operate as a device locator syndrome and a column locator syndrome;
to use the column locator syndrome to locate a column across at least two of the memory devices having an error when there is a column error; and
to use the device locator syndrome to locate a memory device in the plurality of memory devices having an error when there is a device error, wherein a same of the common locator bits are used to locate both one of the columns and the memory devices having errors; and
error correction module to perform error correction on the located memory device or column having the error.

2. The apparatus of claim 1, further comprising:
a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the memory devices to which the data is written in lockstep through the channel.

3. The apparatus of claim 2, wherein the memory modules comprise DIMMs.

4. The apparatus of claim 1, wherein to generate the common locator bits comprises to multiply the device bits, each memory device having m bits, by elements from a $2^m$ Galois field and summing up.

5. The apparatus of claim 1,
wherein to use the column locator syndrome to locate a column across at least two of the memory devices having the column error comprises to use the column locator syndrome and a column parity syndrome to locate a column number in one of the memory devices having the error, and
wherein to use the device locator syndrome to locate a memory device in the memory devices having an error when there is a device error comprises to use the device locator syndrome and a device parity syndrome to locate a device number one of the memory devices having the error.

6. The apparatus of claim 5, wherein the error correction components are further:
to use the device parity syndrome to determine a column position of a failed column within one of the memory devices when there is the column error; and
to determine whether the column number determined from the column locator syndrome and the column parity syndrome matches the column position indicated by the device parity syndrome, wherein column error correction is applied in response to determining that the column number matches the column position.

7. The apparatus of claim 6, wherein when there is the column error, the device parity syndrome includes only a single non-zero column indicating the column position of the failed column.

8. The apparatus of claim 5, further comprising:
a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column;
wherein the error correction components are further:
to use the column parity syndrome to determine whether a device error is in a upper or lower memory device when there is the device error, wherein the device locator syndrome and the device parity syndrome locate the device error in the upper or lower memory device; and
to determine whether the column parity syndrome and the device location syndrome and the device parity syndrome separately identify that the device error is in a same of the upper or lower memory device, wherein device error correction is applied in response to determining that the same upper or lower memory device is identified.

9. The apparatus of claim 1, further comprising:
a channel, wherein data is written lockstep to an upper memory device and a lower memory device through the channel, wherein one column extends through the upper and lower memory devices, such that each column has an upper portion of m bits from the upper memory device in the column and a lower portion of m bits from the lower memory device in the column, and
wherein generating the common locator bits comprises:
for each of the upper memory devices, selecting a unique element from a Galois Field from which consecutive elements from the Galois Field are multiplied by the bits in the upper memory device;
summing results of the multiplication across the upper memory devices to obtain the device locator syndrome for the upper memory devices;
for each of the lower memory devices, selecting an element from the Galois Field that is a fixed distance from the unique element selected for the upper memory device from which consecutive elements from the Galois Field are multiplied by the bits in the lower memory device; and
summing results of the multiplication across the lower memory devices to obtain the device locator syndrome for the lower memory devices, wherein the common locator bits comprise the bits in the upper and lower memory device locator syndromes which also operate as the column locator syndrome.

10. The apparatus of claim 9, wherein the located memory device having the error comprises the upper or lower memory device whose selected unique element from the common locator bits comprises an element determined from using the device locator syndrome and device parity values, and wherein the located column having the error comprises the column whose selected unique element comprises the determined element determined from using the column locator syndrome and column parity syndrome.

11. A system, comprising:
a processor;
a memory subsystem comprising:
a plurality of memory modules each having memory devices each comprising columns of bits, wherein at least two of the memory devices include error correction bits; and
a controller including error correction components:
to generate common locator bits from device bits in a plurality of memory devices in one of the memory modules, wherein the common locator bits include bits that operate as a device locator syndrome and a column locator syndrome;
to use the column locator syndrome to locate a column across at least two of the memory devices having an error when there is a column error; and
to use the device locator syndrome to locate a memory device in the plurality of memory devices having an error when there is a device error, wherein a same of the common locator bits are used to locate both one of the columns and the memory devices having errors;
an error correction module to perform error correction on the located memory device or column having the error; and
a bus coupling the processor to the memory subsystem, wherein the processor accesses programs and data from the memory subsystem to process.

12. The system of claim 11, wherein the memory subsystem further comprises:
a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the memory devices to which the data is written in lockstep through the channel.

13. The system of claim 11, wherein to generate the common locator bits comprises to multiply the device bits, each memory device having m bits, by elements from a $2^m$ Galois field and summing up.

14. The system of claim 11,
wherein to use the column locator syndrome to locate a column across at least two of the memory devices having the column error comprises to use the column locator syndrome and a column parity syndrome to locate a column number in one of the memory devices having the error, and
wherein to use the device locator syndrome to locate a memory device in the memory devices having an error when there is a device error comprises to use the device locator syndrome and a device parity syndrome to locate a device number one of the memory devices having the error.

15. The system of claim 14, wherein the memory subsystem further includes:
a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column;
wherein the error correction components are further:
to use the column parity syndrome to determine whether a device error is in a upper or lower memory device when there is the device error, wherein the device locator syndrome and the device parity syndrome locate the device error in the upper or lower memory device; and
to determine whether the column parity syndrome and the device location syndrome and the device parity syndrome separately identify that the device error is in a same of the upper or lower memory device, wherein device error correction is applied in response to determining that the same upper or lower memory device is identified.

16. The system of claim 11, wherein the memory subsystem further includes:
a channel, wherein data is written lockstep to an upper memory device and a lower memory device through the channel, wherein one column extends through the upper and lower memory devices, such that each column has an upper portion of m bits from the upper memory device in the column and a lower portion of m bits from the lower memory device in the column, and
wherein generating the common locator bits comprises:
for each of the upper memory devices, selecting a unique element from a Galois Field from which consecutive elements from the Galois Field are multiplied by the bits in the upper memory device;
summing results of the multiplication across the upper memory devices to obtain the device locator syndrome for the upper memory devices;
for each of the lower memory devices, selecting an element from the Galois Field that is a fixed distance from the unique element selected for the upper memory device from which consecutive elements from the Galois Field are multiplied by the bits in the lower memory device; and
summing results of the multiplication across the lower memory devices to obtain the device locator syndrome for the lower memory devices, wherein the common locator bits comprise the bits in the upper and lower memory device locator syndromes which also operate as the column locator syndrome.

17. A method for performing error correction in a memory subsystem having memory modules, each including a plurality of memory devices each comprising columns of bits, wherein at least two of the memory devices include error correction bits, comprising:
generating common locator bits from device bits in a plurality of memory devices in one of the memory modules, wherein the common locator bits include bits that operate as a device locator syndrome and a column locator syndrome;
using the column locator syndrome to locate a column across at least two of the memory devices having an error when there is a column error;
using the device locator syndrome to locate a memory device in the plurality of memory devices having an error when there is a device error, wherein a same of the common locator bits are used to locate both one of the columns and the memory devices having errors; and
performing error correction on the located memory device or column having the error.

18. The method of claim 17, wherein the memory subsystem further includes a channel connected to at least two memory ranks in at least one of the memory modules, wherein each of the memory ranks have a plurality of the memory devices, wherein data is written to and read from the memory devices in a lockstep process such that data in a cache line is divided and written to two different memory devices connected on the channel, wherein the two different memory devices are either on different ranks of a same memory module or on different memory modules connected to the channel, and wherein the column having the error extends through both of the devices to which the data is written in lockstep through the channel.

19. The method of claim 17, wherein the generating the common locator bits comprises multiplying the device bits, each memory device having m bits, by elements from a $2^m$ Galois field and summing up.

20. The method of claim 17,
wherein the using the column locator syndrome to locate a column across at least two of the memory devices having the column error comprises using the column locator syndrome and a column parity syndrome to locate a column number in one of the memory devices having the error, and
wherein using the device locator syndrome to locate a memory device in the memory devices having an error when there is a device error comprises using the device locator syndrome and a device parity syndrome to locate a device number in one of the memory devices having the error.

21. The method of claim 20, wherein the memory subsystem further includes a channel, wherein data is written lockstep to an upper memory device and a lower memory device through the channel, wherein one column extends through the upper and lower memory devices, such that each column has an upper portion of bits from the upper memory device in the column and a lower portion of bits from the lower memory device in the column, further comprising:
using the column parity syndrome to determine whether a device error is in a upper or lower memory device when there is the device error, wherein the device locator syndrome and the device parity syndrome locate the device error in the upper or lower memory device; and
determining whether the column parity syndrome and the device location syndrome and the device parity syndrome separately identify that the device error is in a same of the upper or lower memory device, wherein device error correction is applied in response to determining that the same upper or lower memory device is identified.

22. The method of claim 17, wherein the memory subsystem further includes a channel, wherein data is written lockstep to an upper memory device and a lower memory device through the channel, wherein one column extends through the upper and lower memory devices, such that each column has an upper portion of m bits from the upper memory device in the column and a lower portion of m bits from the lower memory device in the column, and wherein generating the common locator bits comprises:
for each of the upper memory devices, selecting a unique element from a Galois Field from which consecutive elements from the Galois Field are multiplied by the bits in the upper memory device;
summing results of the multiplication across the upper memory devices to obtain the device locator syndrome for the upper memory devices;
for each of the lower memory devices, selecting an element from the Galois Field that is a fixed distance from the unique element selected for the upper memory device from which consecutive elements from the Galois Field are multiplied by the bits in the lower memory device; and
summing results of the multiplication across the lower memory devices to obtain the device locator syndrome for the lower memory devices, wherein the common locator bits comprise the bits in the upper and lower memory device locator syndromes which also operate as the column locator syndrome.

* * * * *